United States Patent
Fukase et al.

(10) Patent No.: US 7,005,241 B2
(45) Date of Patent: Feb. 28, 2006

(54) PROCESS FOR MAKING CIRCUIT BOARD OR LEAD FRAME

(75) Inventors: Katsuya Fukase, Nagano (JP); Toyoaki Sakai, Nagano (JP)

(73) Assignee: Shinko Electric Industries Co., Ltd., Nagano (JP)

( * ) Notice: Subject to any disclaimer, the term of this patent is extended or adjusted under 35 U.S.C. 154(b) by 0 days.

(21) Appl. No.: 10/822,825

(22) Filed: Apr. 13, 2004

(65) Prior Publication Data

US 2004/0245213 A1     Dec. 9, 2004

(30) Foreign Application Priority Data

| Jun. 9, 2003 | (JP) | ............................. 2003-163955 |
| Jun. 9, 2003 | (JP) | ............................. 2003-163972 |
| Oct. 15, 2003 | (JP) | ............................. 2003-355350 |
| Oct. 15, 2003 | (JP) | ............................. 2003-355441 |

(51) Int. Cl.
*G03F 7/00* (2006.01)

(52) U.S. Cl. ..................... 430/316; 430/311; 430/312; 430/313; 430/318; 430/319

(58) Field of Classification Search ................ 430/311, 430/312, 313, 316, 318, 319
See application file for complete search history.

(56) References Cited

U.S. PATENT DOCUMENTS

| 5,858,622 | A | * | 1/1999 | Gearhart ..................... 430/315 |
| 6,130,027 | A | * | 10/2000 | Hamada ..................... 430/312 |
| 6,222,136 | B1 | * | 4/2001 | Appelt et al. ................ 174/254 |
| 6,357,023 | B1 | * | 3/2002 | Co et al. ..................... 714/42 |
| 6,583,843 | B1 | * | 6/2003 | Ishino ........................ 349/149 |
| 6,635,407 | B1 | * | 10/2003 | Lokhorst et al. ............ 430/312 |

FOREIGN PATENT DOCUMENTS

| JP | 62-115891 |   | 5/1987 |
| JP | 2-175825 |   | 7/1990 |
| JP | 05-121482 | * | 5/1993 |

* cited by examiner

*Primary Examiner*—Nicole Barreca
(74) *Attorney, Agent, or Firm*—Staas & Halsey LLP

(57) ABSTRACT

A process for making a circuit board comprises the following steps of: half-etching a metal layer formed on an insulating substrate by means of a first masking which is positioned on an upper surface of the metal layer; applying a positive liquid resist on the half-etched metal layer from an upper side of the first masking; exposing the positive liquid resist with parallel light from the upper side of the first masking and developing the positive liquid resist in such a manner that a part of the positive liquid resist located under the first masking is protected to be unexposed and undeveloped; etching again the metal layer by means of a second masking composed of the first masking and the protected positive liquid resist to form a conductive pattern on the insulating substrate; and removing the first masking and the second masking from the metal layer.

19 Claims, 11 Drawing Sheets

FIRST EMBODIMENT

PRIOR ART

FIRST EMBODIMENT

SECOND EMBODIMENT

THIRD EMBODIMENT

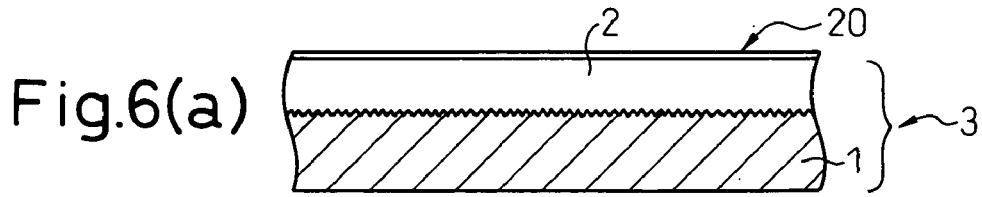
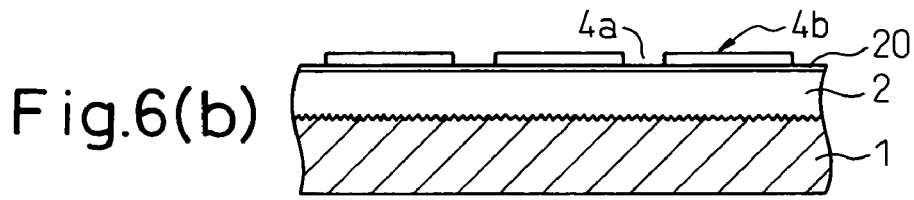
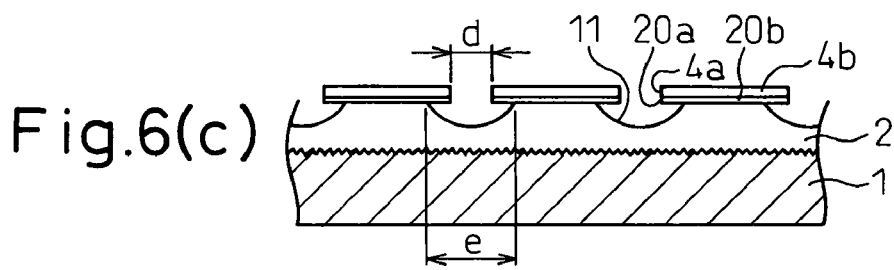
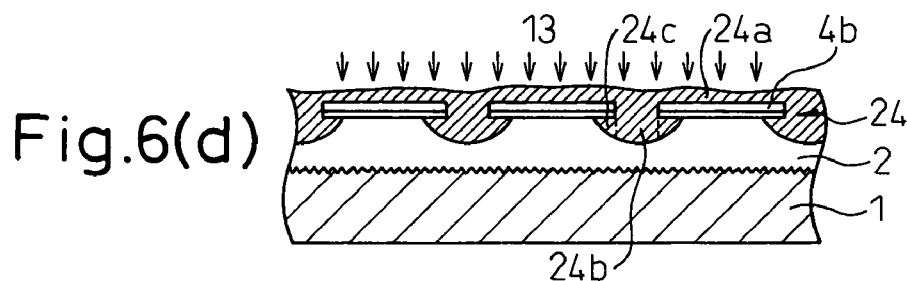
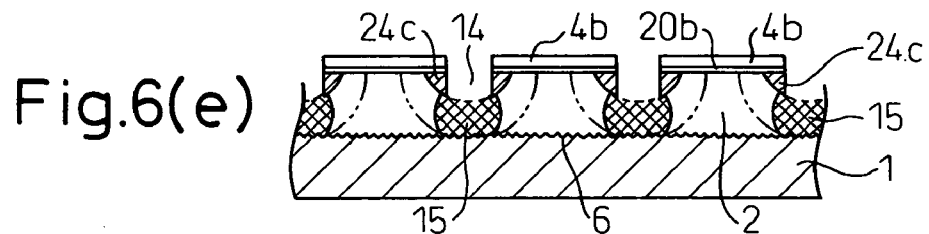
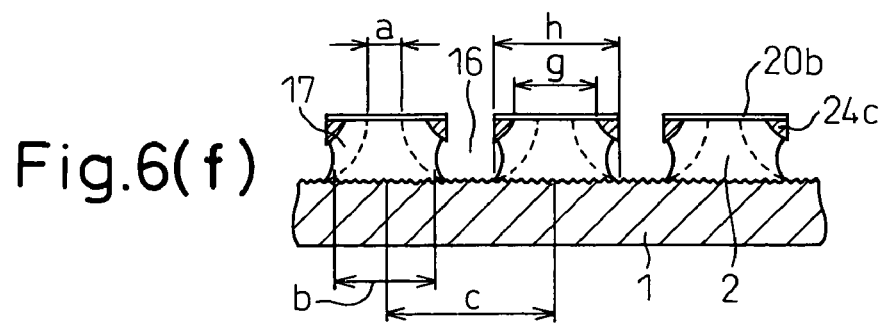

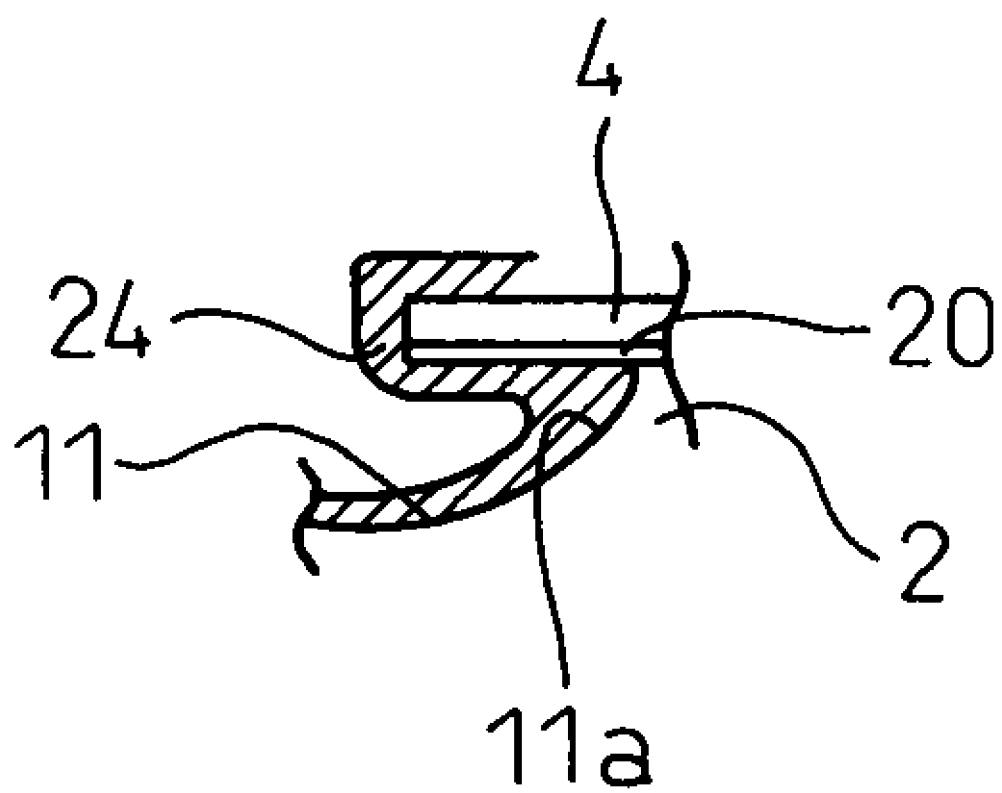

FOURTH EMBODIMENT

FIFTH EMBODIMENT

SIXTH EMBODIMENT

PROCESS FOR MAKING CIRCUIT BOARD OR LEAD FRAME

BACKGROUND OF THE INVENTION

1. Field of the Invention

The present invention relates to a process for making a circuit board or a lead frame. In particular, the present invention relates to a process for making a circuit board with a conductor pattern formed on an insulating substrate by the subtractive method, or a process for making a lead frame or a fine pattern from a metal plate using a patterning technique.

2. Description of the Related Art

The subtractive method is an inexpensive, simple method and has conventionally been used most widely for fabricating circuit boards. With the recent trend toward a higher integration and a finer structure of semiconductor devices and various electronic appliances, however, this method is disadvantageous when producing a fine conductor pattern for the circuit board.

FIGS. 1(a) to 1(d) are sectional views showing the conventional process of fabricating a circuit board by the subtractive method disclosed in Japanese Unexamined Patent Publication No. (JP-A) 62-115891 or Japanese Unexamined Patent Publication NO. (JP-A) 2-175825, and show the process of forming a conductor pattern, on a resin substrate, by etching. As shown in FIG. 1(a), a board member 3 with a copper foil 2 attached to a resin substrate 1 is prepared. As shown in FIG. 1(b), the copper foil 2 is formed with a dry film resist (DFR) or coated with a liquid resist for masking to thereby form a resist 4. The resist 4 is exposed and developed by a well-known method thereby to form a resist pattern 4b. Next, as shown in FIG. 1(c), an etching solution is applied to etch the portions 4a other than the portions of the copper foil 2 formed with the resist pattern thereby to leave a copper pattern. As shown in FIG. 1(d), the resist pattern 4b is then removed, so that the remaining copper foil portion constitutes a conductor pattern 5.

According to the conventional method of fabricating a circuit board described above, however, as shown in FIG. 1C, each portion of the conductor pattern 5 tends to assume a substantially trapezoidal shape in which the width (a) of the upper part formed with the resist is smaller than the pattern width (b) near to the boundary surface 6 between the resin substrate 1 and the copper foil 2. This is due to the fact that during the progress of the etching process, the etching solution is applied also to the portion immediately under the masking 4 so that the copper foil 2 is side etched. Especially, the boundary surface 6 between the resin substrate 1 and the copper foil 2 generally has a fine unevenness as shown, and therefore it requires considerable time before the etching solution is sufficiently applied to the uneven boundary surface 6. During this time, the etching solution is undesirably applied also to the portion immediately under the masking 4, as described above.

An attempt to reduce the width of each pattern portion 5 or the pitch (c) between adjacent pattern portions would make it difficult to secure a sufficient width especially at the upper part of the pattern 5 far from the resin substrate 1, which in turn makes it difficult to achieve a fine structure.

SUMMARY OF THE INVENTION

Accordingly, it is an object of this invention to provide a method of fabricating a circuit board or a lead frame with a fine conductor pattern by use of an inexpensive, simple subtractive method or a patterning technique and an etching technique, and a circuit board or a lead frame fabricated by the method.

According to the present invention, there is provided a process for making a circuit board comprising the following steps of: half-etching a metal layer formed on an insulating substrate by means of a first masking which is positioned on an upper surface of the metal layer; applying a positive liquid resist on the half-etched metal layer from an upper side of the first masking; exposing the positive liquid resist with light from the upper side of the first masking and developing the positive liquid resist in such a manner that a part of the positive liquid resist located under the first masking is protected to be unexposed and undeveloped; etching again the metal layer by means of a second masking composed of the first masking and the protected positive liquid resist to form a conductive pattern on the insulating substrate; and removing the first masking and the second masking from the metal layer.

In the step of exposing the positive liquid resist with light from the upper side of the first masking, a parallel light perpendicular to a surface of the metal layer is used.

The insulating substrate is flexible so that a tape automated bonding (TAB) type circuit board is thus made.

According to another aspect of the present invention, there is provided a process for making a circuit board comprising the following steps of: forming a first metal layer on an insulating substrate and forming a second metal layer on the first metal layer, the second metal layer having a smaller thickness than that of the first metal layer; applying a first resist on the second metal layer and patterning the first resist to provide with openings; selectively etching only the second metal layer through the openings of the patterned second metal layer; half-etching the first metal layer by means of a first masking composed of the first resist and the second metal layer located just under the first resist; applying a positive liquid, second resist on the half-etched first metal layer from an upper side of the first masking; exposing the positive liquid resist with light from the upper side of the first masking and developing the positive liquid resist in such a manner that a portion of the positive liquid resist located under the first masking is protected to be unexposed and undeveloped; etching again the metal layer by means of a second masking composed of the first masking and the protected positive liquid resist to form a conductive pattern on the insulating substrate; and removing the first resist and the second resist.

The second metal layer is removed by etching after the first resist and the second resist are removed.

The step of removing the first resist and the second resist comprises the following sub-steps of: first peeling only the second resist and then removing the second metal layer by etching to remove the first resist.

According to still another aspect of the present invention, there is provided a process for making a circuit board comprising the following steps of: forming a first metal layer on an insulating substrate and forming a second metal layer on the first metal layer, the second metal layer having smaller thickness than that of the first metal layer; applying a first resist on the second metal layer and patterning the first resist to provide with openings; etching selectively only the second metal layer through the openings of the patterned second metal layer; half-etching the first metal layer by means of a first masking composed of the first resist and the second metal layer located just under the first resist; applying a permanent-type positive liquid, second resist on the half-etched first metal layer from an upper side of the first masking; exposing the positive liquid resist with light from the upper side of the first masking and developing the positive liquid resist in such a manner that a portion of the positive liquid resist located under the first masking is protected to be unexposed and undeveloped; etching again the metal layer by means of a second masking composed of the first masking and the protected positive liquid resist to form a conductive pattern on the insulating substrate; and removing the first resist and the permanent-type positive liquid, second resist, except for a part of the second resist protected to be unexposed and undeveloped.

In a step of removing the first resist and the second resist, a solution with which the first resist reacts, but the second resist does not react, is used.

According to still another aspect of the present invention, there is provided a process for making a lead frame comprising the following steps of: half-etching a metal plate from respective sides thereof by means of first maskings which are positioned on respective surfaces of the metal plate; applying positive liquid resist on the half-etched plate from respective sides of the first maskings; exposing the positive liquid resist with light from respective sides of the first masking and developing the positive liquid resist in such a manner that a portion of the positive liquid resist located under the first masking is protected to be unexposed and undeveloped; etching again the metal layer by means of second masking composed of the first masking and the protected positive liquid resist to form a conductive pattern on the insulating substrate; and removing the first masking and the second masking from the metal layer.

According to a further aspect of the present invention, there is provided a process for making a lead frame comprising the following steps of: forming thin, second metal layers on respective surfaces of a metal plate; applying first resist on the second metal layers and patterning the first resist to provide with openings; etching selectively only the second metal layers through the openings of the patterned second metal layers; half-etching the metal plate by means of first maskings composed of the first resist and the second metal layers located just under the first resists; applying a positive liquid second resist on the half-etched first metal layer from respective sides of the first maskings; exposing the positive liquid resist with light from respective sides of the first maskings and developing the positive liquid resist in such a manner that portions of the positive liquid resist located under the first maskings are protected to be unexposed and undeveloped; etching again the metal plate by means of second maskings each composed of the first masking and the protected positive liquid resist to form a conductive pattern; and removing the first resist and the second resist.

According to still further aspect of the present invention, there is provided a process for forming a fine pattern on a metal plate comprising the following steps of: half-etching a metal plate from one or respective side thereof by means of first masking which is positioned on one or respective surface of the metal plate; applying positive liquid resist on the half-etched metal plate from one or respective side of the first masking; exposing the positive liquid resist with light from one or respective sides of the first masking and developing the positive liquid resist in such a manner that a portion of the positive liquid resist located under the first masking is protected to be unexposed and undeveloped; etching again the metal plate from one or respective side thereof by means of second masking composed of the first masking and the protected positive liquid resist; and removing the first masking and the second masking from the metal plate.

According to still further aspect of the present invention, there is provided a process for making a circuit board comprising the following steps of: coating a metal layer formed on an insulating substrate with a first resist and patterning the first resist; forming light-block film on the patterned first resist; half-etching the metal layer by means of a first masking composed of the first resist and the light-block film; applying a positive liquid resist on the half-etched metal layer from an upper side of the first masking; exposing the positive liquid resist with light from the upper side of the first masking and developing the positive liquid resist in such a manner that a portion of the positive liquid resist located under the first masking is protected to be unexposed and undeveloped; etching again the metal layer by means of a second masking composed of the first masking and the protected positive liquid resist to form a conductive pattern on the insulating substrate; and removing the first masking and the second masking from the conductive pattern on the insulating substrate formed on the insulating substrate.

According to still further aspect of the present invention, there is provided a process for making a lead frame comprising the following steps of: coating respective surfaces of a metal plate with first resist and patterning the first resist; forming light-block film on the patterned first resist; half-etching the metal plate from respective sides thereof by means of first maskings each composed of the first resist and the light-block film; applying positive liquid resist on the half-etched plate from respective sides of the first maskings; exposing the positive liquid resist with light from respective sides of the first maskings and developing the positive liquid resist in such a manner that a portion of the positive liquid resist located under the first masking is protected to be unexposed and undeveloped; etching again the metal plate from respective sides thereof by means of second maskings each composed of the first masking and the protected positive liquid resist; and removing the first masking and the second masking from the metal plate.

According to still further aspect of the present invention, there is provided a process for forming a fine pattern on a metal plate comprising the following steps of: coating one or respective surfaces of a metal plate with first resist and patterning the first resist; forming light-block film on the patterned first resist; half-etching the metal plate from one or respective side thereof by means of first masking composed of composed of the first resist and the light-block film; applying positive liquid resist on the half-etched metal plate from one or respective side of the first masking; exposing the positive liquid resist with light from one or respective sides of the first masking and developing the positive liquid resist in such a manner that a portion of the positive liquid resist located under the first masking is protected to be unexposed and undeveloped; etching again the metal plate from one or respective side thereof by means of second masking composed of the first masking and the protected positive liquid resist; and removing the first masking and the second masking from the metal plate.

BRIEF DESCRIPTION OF THE DRAWINGS

FIGS. 6(a) to 6(f) are sectional views showing the fabrication process according to a modification of the second embodiment of the invention;

FIG. 8 is a sectional view showing a portion coated with a positive photosensitive permanent resist;

DESCRIPTION OF THE PREFERRED EMBODIMENTS

Embodiments of the invention are described in detail, below, with reference to the accompanying drawings.

FIGS. 2(a) to 2(f) are sectional views showing the process of fabricating a circuit board using the subtractive method according to a first embodiment of the invention.

Figure 1A:
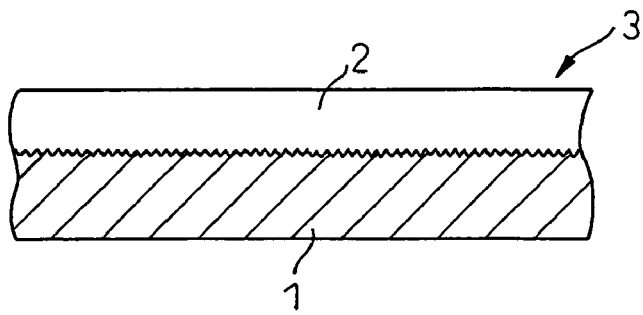
FIGS. 1(a) to 1(d) are sectional views of a circuit board fabricated by the conventional subtractive method.
Figure 1B:
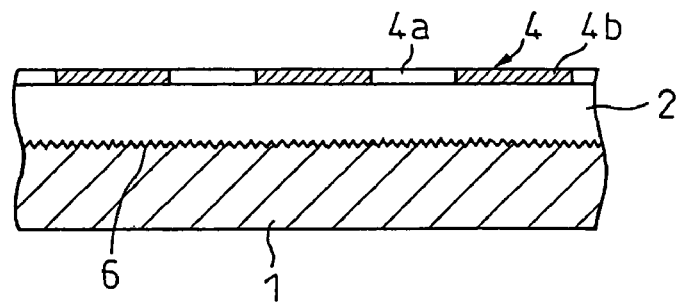
Figure 1C:
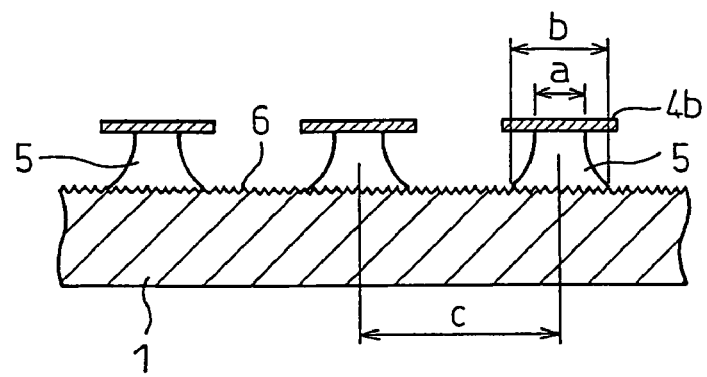
Figure 1D:
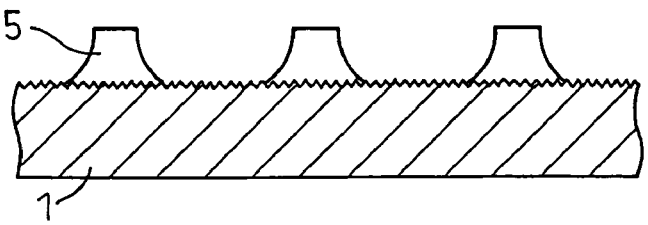
Figure 2A:
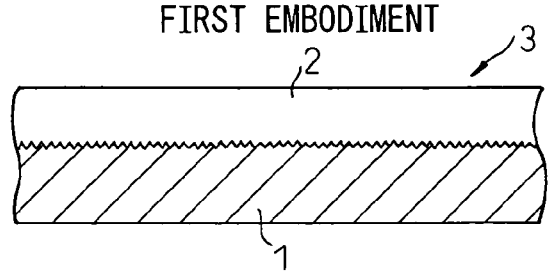
FIGS. 2(a) to 2(f) are sectional views showing the process of fabricating a circuit board by the subtractive method according to the invention.

In FIG. 2(a), a copper foil 2 is formed as a metal layer on a resin substrate 1 by a well-known method thereby to make up a substrate member 3. The resin substrate 1 is generally constituted of epoxy resin or glass epoxy resin.

Figure 2B:
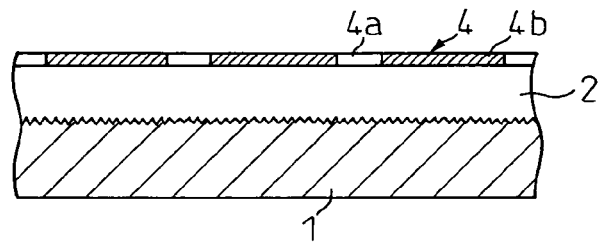

Next, in FIG. 2(b), a dry film resist (DFR) having a light-blocking characteristic is formed as a first masking 4 on the upper surface of the copper foil 2, and exposed and developed by a well-known method thereby to form a resist pattern 4b.

Figure 2C:
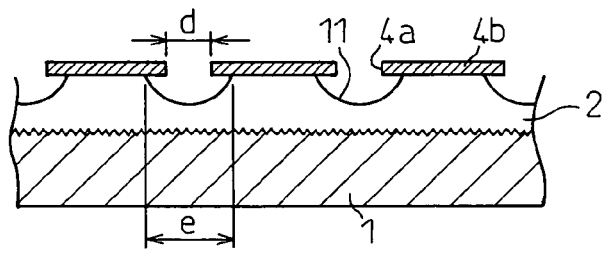

Next, in FIG. 2(c), the etching solution is applied toward the first masking 4 formed of the openings 4a and the resist pattern 4b thereby to conduct the half etching. This half etching melts the peripheral area of the copper foil 2 under the etching solution passed portions 4a of the first masking 4. Thus, the half etching conditions (etching time, etc.) are adjusted in such a manner that each etched portion 11 of the copper foil 2 leaves a desired width at the upper part of the pattern portion 17 (FIG. 2(f)).

In this way, as shown in the drawings, at the upper portion of the copper foil 2 in proximity with the resist of the first masking pattern 4b, the etched portion 11 of the copper foil 2 bites somewhat more into the copper foil 2 than the width (d) of the etching solution passed portion 4a of the resist pattern thereby to perform what is called the side etching. Thus, the width (e) of the etched portion 11 is larger than the resist pattern width (d), while the intermediate area between the upper portion of the copper foil 2 and the boundary surface 6 in contact with the resin substrate 1 is rounded, thereby forming a groove 11 having a substantially U-shaped cross section as a whole.

Figure 2D:
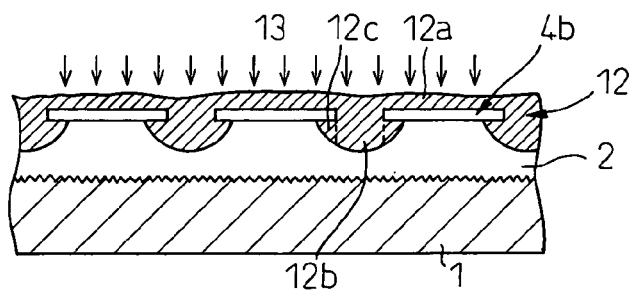

Next, in FIG. 2(d), the whole surface of the portion half-etched in the preceding step is coated with a positive liquid resist 12. Under this condition, the whole surface of the portion coated with the positive liquid resist 12 is exposed to the parallel light 13. The light 13 used for exposure is desirably parallel light rays radiated toward the first masking pattern 4b in the direction at right angles to the surface of the first masking 4 of the circuit board. In the case where the light rays reach deep into the positive liquid resist 12, however, the light 13 is not necessarily parallel light.

In this exposure step, the portion of the positive liquid resist 12 exposed to the light includes the area 12a of the positive liquid resist 12 above the first masking pattern 4b, the opening 4a of the first masking pattern 4b, and the area 12b immediately under each opening 4a. In other words, that area 12c under the non-transmitted portion 4b of the first masking pattern which is etched by biting somewhat more into the copper foil 2 than the width (d) of the resist pattern at the time of half etching in the preceding step is left unexposed. By the way, the resist of the second masking 12 may be formed by electrodeposition of a positive resist on only the portion having a metal.

The first embodiment uses two photosensitive resists making up the first masking and the second masking, i.e. the dry film resist 4 and the positive liquid resist or the positive electrodeposition resist 12. The photosensitive wavelengths of these photosensitive resists are required to be appropriately combined with the exposure wavelengths used. The wavelength of the parallel light 13 selected for exposing the positive liquid resist and the positive electrodeposition resist 12, therefore, is required to be absorbed by the positive liquid resist or the positive electrodeposition resist 12 but not to be transmitted through the dry film resist 4.

Figure 2E:
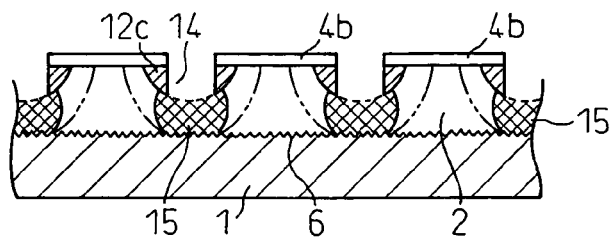

Next, in FIG. 2(e), the exposed portions 12a, 12b of the positive liquid resist 12 are developed thereby to etch only the light-exposed portions 12a, 12b of the positive liquid resist 12. In this way, it becomes possible to remove the etched portions 12a, 12b of the positive liquid resist 12. Each unetched portion 12c of the positive liquid resist 12 remains as it is, while each substantially U-shaped groove 11 described above forms a groove 14 having parallel inner walls on the two sides thereof, and each unetched portion 12c of the positive liquid resist 12 is used as a mask pattern (second masking) in the next step.

Then, the secondary etching is performed using, as a mask pattern, the dry film resist (first masking) 4 on the surface of the remaining copper foil 2 and the remaining portion 12c (second masking) of the positive liquid resist. As a result, the copper foil portion 15 under the parallel-wall groove 14 is etched, and the etched portion reaches the boundary surface 6 where the copper foil 2 and the resin substrate 1 are in contact with each other.

Next, the dry film resist 4 and the remaining positive liquid resist 12c are separated.

Figure 2F:
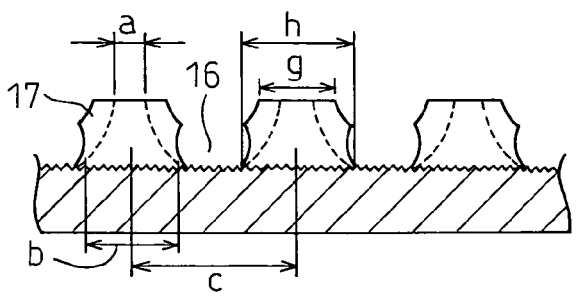

As a result, as shown in FIG. 2(f), a Dharma doll-shaped groove 16 is formed with a narrow central portion and round-expanded upper and lower portions along the depth. Specifically, the difference between the width (g) of the narrowest portion and the width (h) of the widest portion of the cross section of the conductor pattern 17 is much smaller than the width difference (b–a) of the trapezoidal cross section of the conventional conductor pattern shown in FIG. 1. As a result, the pitch (c) between adjacent pattern portions can be reduced thereby to achieve a finer circuit board.

FIGS. 3(a) to 3(f) are cross sectional views of the circuit board in the fabrication process according to the second embodiment using the subtractive method. Unlike in the first embodiment requiring a light-blocking resist (i.e. a resist through which the parallel light 13 is not passed), the first resist 4 according to the second embodiment requires no light-blocking characteristic. Only the points in which the second embodiment is different from the first embodiment are explained below.

Figure 3A:
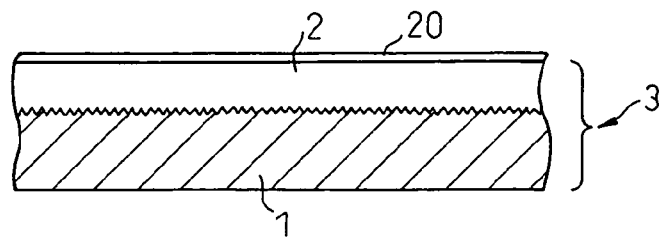
FIGS. 3(a) to 3(f) are sectional views showing the process of fabricating a circuit board according to a second embodiment of the invention.

First, according to the second embodiment, as shown in FIG. 3(a), a thin second metal layer 20 is formed on the copper foil 2 of a substrate member 3 including a resin substrate 1 formed with a copper foil 2 constituting a first metal layer. The thin second metal layer 20 may be a silver plating as described later.

Figure 3B:
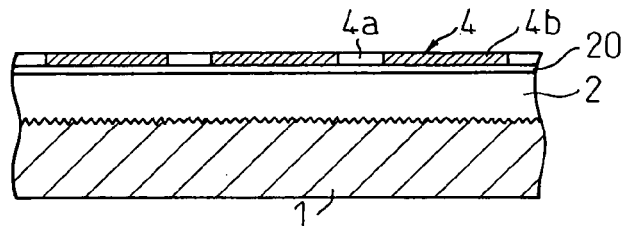

Next, as shown in FIG. 3(b), as in the first embodiment, a dry film resist (DFR) is formed as a first resist 4 on the upper surface of the second metal layer 20, and exposed and developed by a well-known method thereby to form a resist pattern 4b.

Figure 3C:
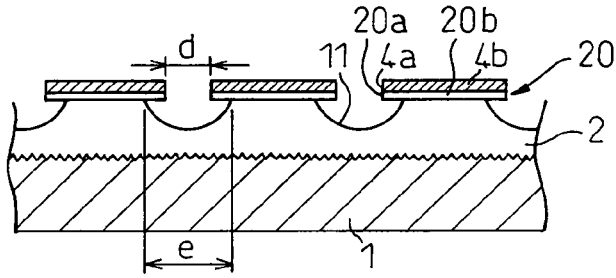

In FIG. 3(c), only the thin second metal layer 20 is selectively removed by the quick etching process through each opening 4a of the patterned first resist 4 formed on the upper surface of the second metal layer 20. As a result, only the portion of the second metal layer 20 corresponding to each opening 4a of the first resist 4 is removed. In the case where silver is used for the second metal layer 20, for example, the parting solution as described in JP-A 2-175825, and capable of separating the silver without damaging the undercoating copper or copper alloy disclosed in JP-A 62-115891 material, may be used.

With the first resist 4 and the second metal layer 20 as a first masking, the etching solution is applied thereby to half-etch the copper foil 2 constituting the first metal layer 2. As the result of the half-etching, the peripheral area of the copper foil 2 under each etching solution passed opening 4a of the first masking 4 of the copper foil 2 is etched. The conditions for this half-etching process are similar to those in the first embodiment.

Figure 3D:
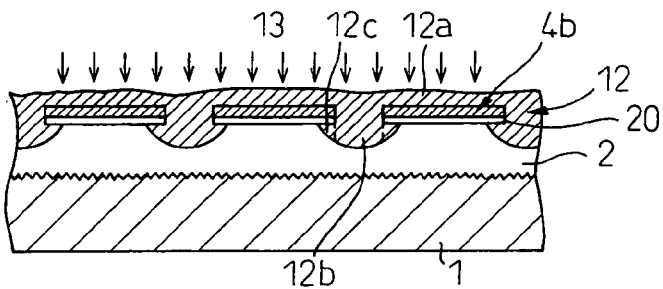

In FIG. 3(d), as in the first embodiment, the whole surface including the portion half-etched in the preceding step is coated with the second resist 12 of positive liquid type and exposed. In this case, the first resist 4 has no light-blocking characteristic but the second metal layer 20 has a light-blocking characteristic. Therefore, the masking function can be sufficiently exhibited at the time of exposure by using the first resist 4 and the second metal layer 20 combined as a second masking.

Figure 3E:
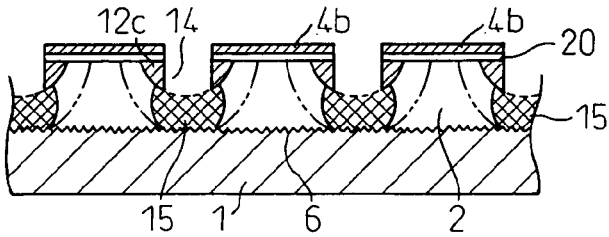

In FIG. 3(e), the exposed portions 12a, 12b of the second resist 12 are developed thereby to etch only the light-exposed portions 12a, 12b of the second resist 12. The unetched portion 12c of the second resist 12 can be used as a mask pattern (second masking) in the next step.

Next, as in the first embodiment, the secondary etching process is executed using a mask pattern including the first resist 4, the second metal layer 20 (first masking) and the remaining portion 12c of the second resist of positive liquid type (second masking) remained on the surface of the copper foil 2.

Then, the dry film resist (first resist 4) and the remaining positive liquid resist (second resist) 12c are separated. Further, the second metal layer 20 is removed by the quick etching process, etc. as required. In the case where the second metal layer 20 formed on the copper pattern 17 is used as a part of the conductor pattern, the process of separating the second resist 12c is followed by removing only the exposed portion of the second metal layer 20 by the quick etching process, etc. after which the first resist 4 is separated.

Figure 3F:
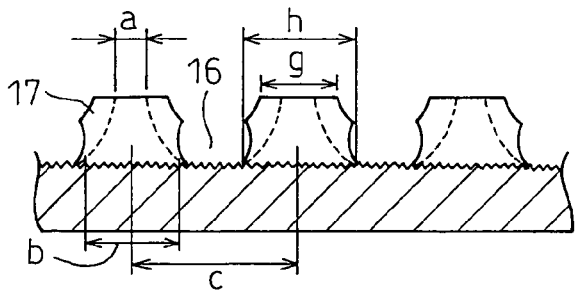

As a result, as in the first embodiment, a conductor pattern 17 can be obtained whereby a circuit board of a finer structure can be produced as shown in FIG. 3(f). Also, according to the second embodiment, a resist having no light-blocking characteristic can also be used as the first resist 4 as described above.

Figure 4A:
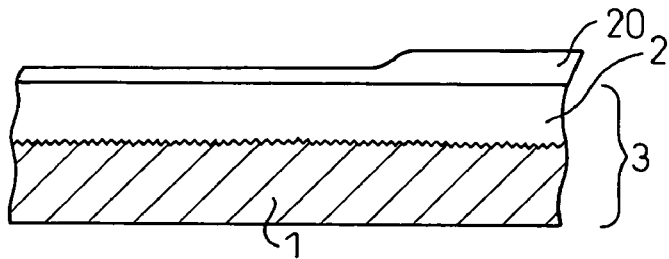
FIGS. 4(a) to 4(f) show a modification of the fabrication process shown in FIG. 3.
Figure 4B:
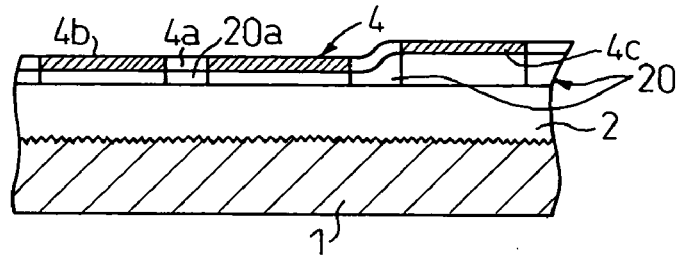
Figure 4C:
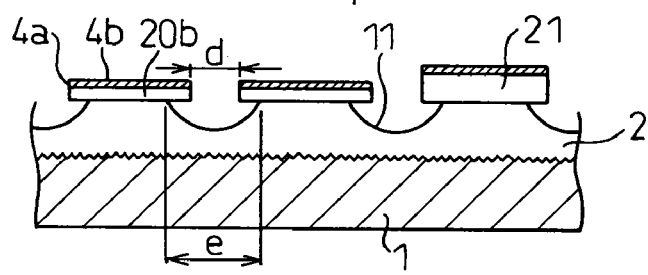

FIGS. 4(a) to 4(f) show a modification of the second embodiment shown in FIG. 3, in which a part of the second metal layer 20 is intended to be used for an electrode requiring the plating of a precious metal such as a wire bonding pad or a flip chip pad. In the step shown in FIG. 4(a), a part of the second metal layer 20 is formed with a greater thickness using a plating mask or the like. In the step of FIG. 4(b), as in the step of FIG. 3(b), the first resist 4 is formed on the upper surface of the second metal layer 20 and patterned, exposed and developed only the second metal layer 20 is selectively subjected to the quick etching process through the opening 4a of the patterned first resist 4 formed on the upper surface of the second metal layer 20. In this way, only the portion 20a of the second metal layer 20 corresponding to the opening 4a of the first resist 4 is removed. Next, the first metal layer 2 is subjected to the half-etching process as designated by numeral 11. As shown in FIG. 4(c), a thick portion 21 of the second metal layer 20 is left in the same thickness.

Figure 4D:
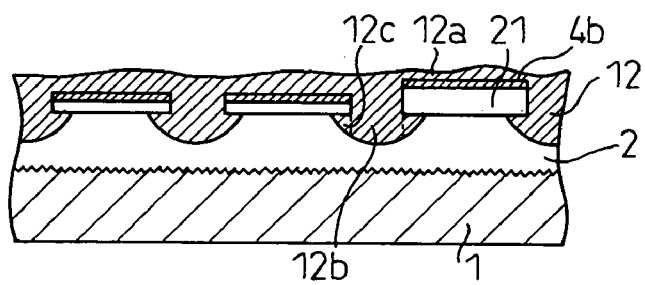
Figure 4E:
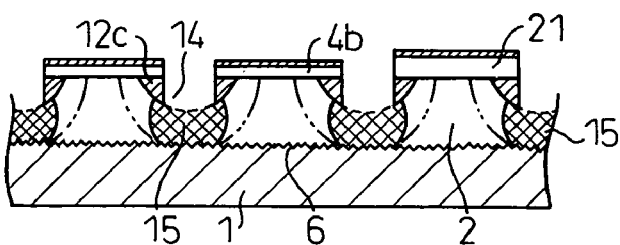
Figure 4F:
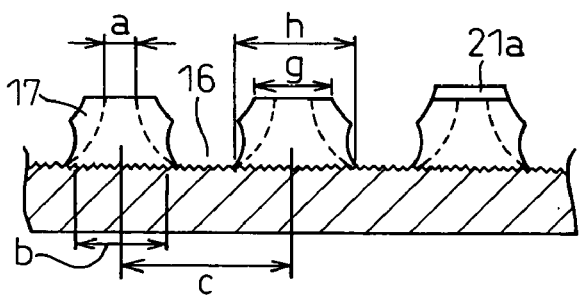

The steps shown in FIGS. 4(d), 4(e) are similar to those shown in FIGS. 3(d), 3(e) except for the fact that the portion 21 of the second metal layer 20 is formed as a thick layer. At the time of separating the second metal layer 20 by quick etching or a like process, as required, however, the thin other portion of the second metal layer 20 is separated substantially entirely, while the surface of the portion of the second metal layer 21 is etched off only partly. Thus, as shown in FIG. 4(f), the metal of the thick portion of the second metal layer 21 partly remains unetched. This remaining portion 21a can be used as an electrode such as a wire bonding pad or a flip chip pad.

FIGS. 5(a) to 5(f) are sectional views of a lead frame in fabrication process by the subtractive method according to a third embodiment of the invention. The third embodiment is basically similar to the second embodiment except that the third embodiment is applicable to the lead frame. Only the different points of the third embodiment from the second embodiment are described below.

Figure 5A:
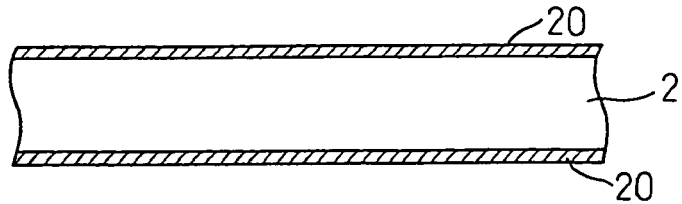
FIGS. 5(a) to 5(f) are sectional views showing the process of fabricating a lead frame according to a third embodiment of the invention.

First, in FIG. 5(a), a copper plate 2 making up a substrate of the lead frame is prepared, and the two surfaces of the copper plate 2 are each formed with a thin second metal layer 20 capable of being partly plated.

Figure 5B:
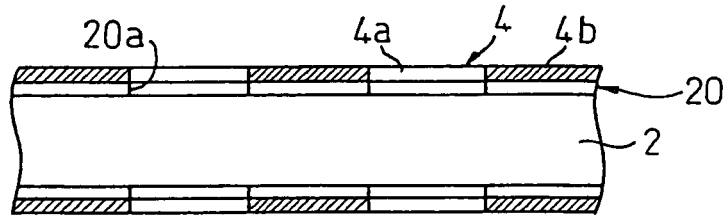

Next, in FIG. 5(b), as in the first embodiment, a dry film resist (DFR) is formed, as a first resist 4, on each of the second metal layers 20, and is patterned, exposed and developed by a well-known method thereby to form a resist patterns 4b. The thin second metal layers 20 are selectively subjected to the quick etching process through the openings 4a of the patterned first resists 4 formed on the surface of the second metal layers 20. As a result, only the portions 20a of the second metal layers 20 corresponding to the openings 4a of the first resist 4 are removed. In the case where the second metal layers 20 are formed of silver, for example, the silver can be separated without adversely affecting the undercoating copper or copper alloy material as described in JP-A No. 62-115891 by suitably using the separation agent as described in JP-A 2-175825.

Figure 5C:
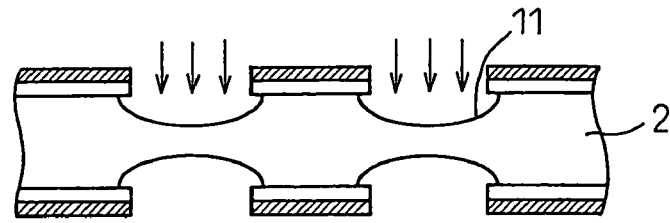

In FIG. 5(c), the etching solution is applied to half etch the copper plate 2 from the two surfaces thereof with the first resists 4 and the second metal layers 20 as a first masking. As the result of this half etching process, the peripheral area 11 of the copper foil 2 under the etching solution passed portions 4a, 20a of the first masking 4 of the copper plate 2 is etched. The half etching depth is appropriately set in such a manner as to secure the desired width of the conductor pattern.

Figure 5D:
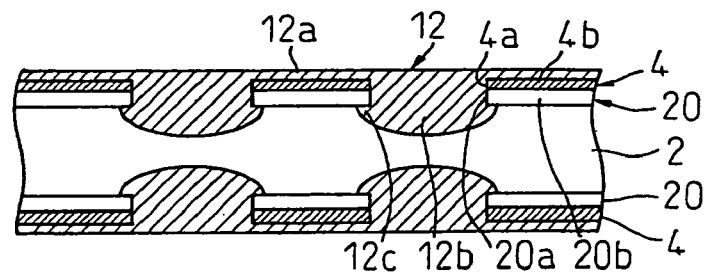

Next, as shown in FIG. 5(d), as in the first embodiment, the whole surface including the portion 11 half etched in the preceding step is coated with the second resist 12 of a positive liquid type and exposed. In this case, the first resists 4 have no light-blocking characteristics. As the second metal layers 20 have a light-blocking ability, however, the first resists 4 and the second metal layers 20, combined, exhibit a masking function sufficiently at the time of exposure.

Figure 5E:
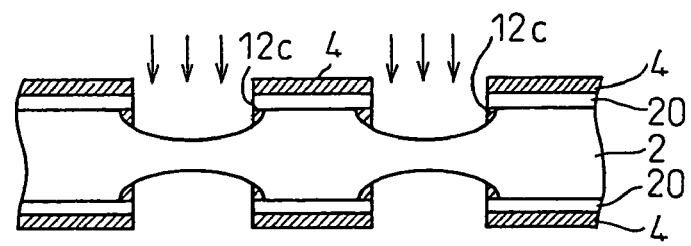

In FIG. 5(e), the exposed portions 12a, 12b of the second resist 12 are developed thereby to etch only the photosensitized portions 12a, 12b of the second resist. Each unetched portion 12c of the second resist 12 can be used as a mask pattern (second masking) in the next step.

Figure 5F:
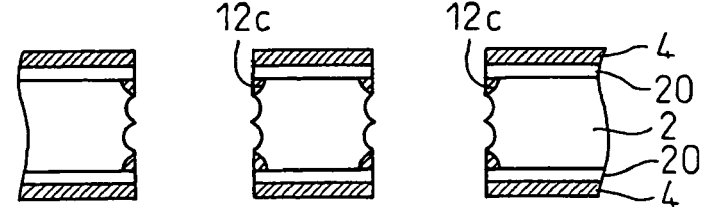

As shown in FIG. 5(f), as in the first embodiment, the secondary etching is carried out using a mask pattern including the remaining part of each first resist 4 on the surface of the copper plate 2, the second metal layers 20 (first masking) and the remaining portion 12c (second masking) of the second resist of positive liquid type.

Next, though not shown, the dry film resist (first resist 4) and the remaining positive liquid resist (second resist) 12c are separated. Further, the second metal layers 20 are separated by the quick etching or the like process as required. In the case where each second metal layer 20 formed on the copper pattern is used directly as a part of the conductor pattern, the second metal layers 20 are not necessarily separated.

FIGS. 6(a) to 6(f) show a modification of the second embodiment of the invention shown in FIGS. 3(a) to 3(f). According to the second embodiment, the second resist 12 of positive liquid type is used, whereas according to this modification, a positive photosensitive permanent resist 24 is used. The positive photosensitive permanent resist 24 is left as a part of the circuit pattern without being removed in the subsequent process of removing the first resist. Only the points different from the second embodiment are described below. A polyimide resin high in chemical resistance is used for the positive photosensitive permanent resist 24.

As shown in FIG. 6(a), a thin second metal layer 20 is formed on the copper foil 2 of the substrate material 3 in the same way as in FIG. 3(a). In FIG. 6(b), a dry film resist (DFR) is formed as a first resist 4 on the upper surface of the second metal layer 20, and is patterned, exposed and developed to thereby form a resist pattern 4b in the same manner as in FIG. 3(b). In FIG. 6(c), the copper foil 2 making up the second metal layer 2 is half etched with the openings 4a of the first resist 4 and the openings 20a of the thin second metal layer 20 as a first masking in the same manner as in FIG. 3(c).

In FIG. 6(d), this modification uses a positive photosensitive permanent resist 24 in place of a normal positive liquid resist 12 used in the second embodiment. The positive photosensitive permanent resist 24 is coated over the entire surface including the portions half etched in the preceding step. Even though the first resist 4 may have no light-blocking ability, as in the second embodiment, the second metal layer 20 has it. By using the first resist 4 and the second metal layer 20 combined as a second masking, therefore, the masking function can be sufficiently exhibited at the time of exposure. Under these conditions, the whole surface of the portion coated with the positive photosensitive permanent resist 24 is exposed by the parallel light 13.

In FIG. 6(e), only the exposed portions 24a, 24b of the second resist 24 providing a positive photosensitive permanent resist are developed, so that only the photosensitized portions 24a, 24b of the second resist are etched. The portion 24c not etched can be used as a mask pattern (second masking) in the next step. The secondary etching process is carried out as in the aforementioned embodiments using a mask pattern including the first resist 4, the second metal layer 20 (first masking) and the remaining portion 24c (second masking) of the positive photosensitive permanent resist 24 left on the surface of the copper foil 2.

In FIG. 6(f), only the dry film resist (first resist 4) is separated using a strong alkali solution such as sodium hydroxide aqueous solution. The remaining portion 24c of the positive photosensitive permanent resist which is high in chemical resistance is not removed, and it is left as it is to form a part of the circuit pattern.

Next, the thin second metal layer 20 formed on the copper circuit pattern 17 is removed by the quick etching process or the like as required.

FIGS. 7(a) to 7(f) show a modification corresponding to that shown in FIG. 4(a) to 4(f), in which a part of the second metal layer 20 is intended to be used for an electrode requiring the plating of a precious metal such as a wire bonding pad or a flip chip pad. Also, the positive photosensitive permanent resist 24 is used as a second resist. This positive photosensitive permanent resist 24 remains unremoved and is left as a part of the circuit pattern in the subsequent step of removing the first resist. Only the points different from the embodiment shown in FIGS. 4(a) to 4(f) are described below.

Figure 7A:
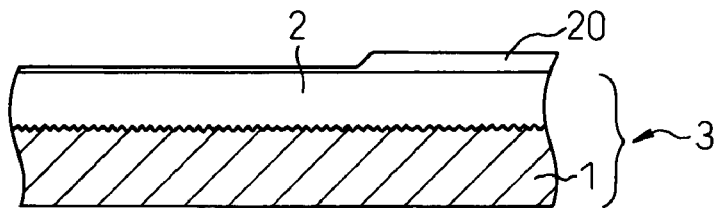
FIGS. 7(a) to 7(f) are sectional views showing the fabrication process according to a further modification of the modification shown in FIG. 4.
Figure 7B:
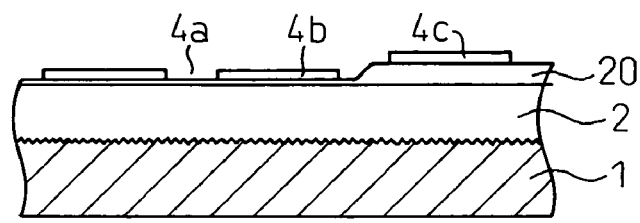
Figure 7C:
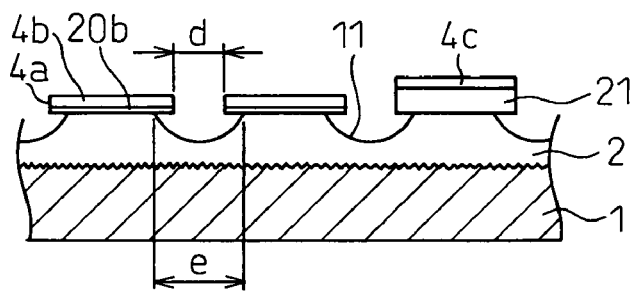

The steps shown in FIGS. 7(a), 7(b) and 7(c) are similar to those shown in FIGS. 4(a), 4(b) and 4(c), respectively.

Figure 7D:
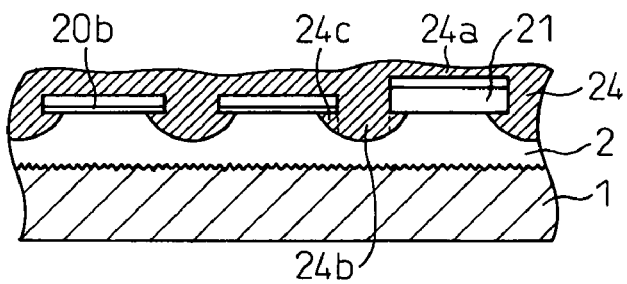

In FIG. 7(d), as in FIG. 6(d), the positive photosensitive permanent resist 24 is used in place of the ordinary positive liquid resist 12. This positive photosensitive permanent resist 24 is coated and exposed over the entire surface of the portion subjected to the half etching process in the preceding step.

Figure 7E:
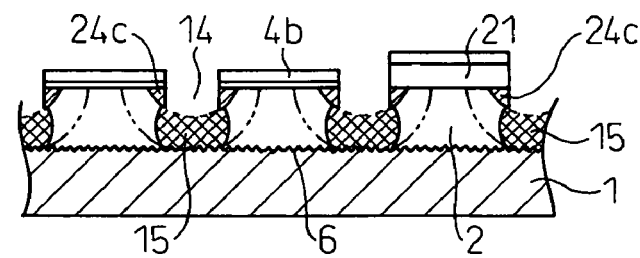

In FIG. 7(e), as in FIG. 6(e), the exposed portions 24a, 24b of the second resist 24 making up a positive photosensitive permanent resist are developed thereby to etch only the photosensitized second resist portions 24a, 24b. The secondary etching is carried out using a mask pattern including the first resist 4, the second metal layer 20 (first masking) and the remaining portion 24c (second masking) of the positive photosensitive permanent resist 24 left on the surface of the copper foil 2.

Figure 7F:
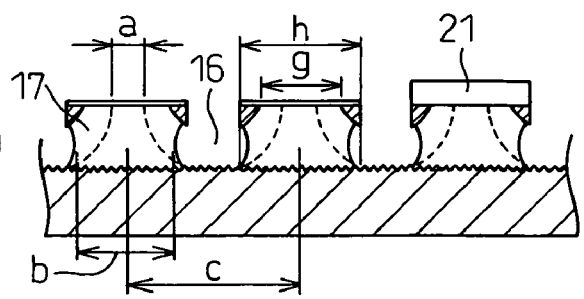

In FIG. 7(f), as in the case of FIG. 6(f), only the dry film resist (first resist 4) is separated. The remaining positive photosensitive permanent resist portion 24c is not removed, and it is left as it is to form a part of the circuit pattern 17. Whenever required, the thin second metal layer 20 formed on the copper circuit pattern 17 is removed by the quick etching or the like process.

FIG. 8 shows a case in which the positive photosensitive permanent resist 24 is coated as a second resist along the upper and side surfaces of the dry film resist (first resist 4), the side etching portion 11a of the copper foil 2 and the half etching portion 11. Also in this case, only the unexposed portion of the positive photosensitive permanent resist 24 under the first resist 4 is held.

The first to third embodiments are explained above with reference to a case in which the first metal layer 2 is formed of copper as a material to be etched. Nevertheless, a material such as a copper alloy, iron-nickel alloy/alloy 42, SUS or the like can be used with equal effect. Also, a silver plating (1 to 5 μm thick, for example) is used for the second metal layer 20, of which a copper strike plating (plating as thin as 0.1 to 0.3 μm) is applied as an undercoating layer. Nickel plating is another choice. As another alternative, the second metal layer 20 may be a thin film of iron, nickel or chrome formed by sputtering.

The resist (dry film resist or liquid-type positive resist) can be separated using an alkali aqueous solution such as sodium hydroxide. Also, the use of an alkali potassium ferricyanide solution makes it possible to separate the resist while at the same time removing the chrome selectively.

As described above, according to the first to third embodiments, the pitches of the conductor pattern or the lead of the circuit board or the lead frame can be reduced. Also, the width of the upper portion of the conductor pattern or the lead can be secured, thereby reducing the difference between the width of the upper pattern (lead) and the width of the lower pattern (lead). Further, the circuit board having a thick conductor pattern or the lead frame having a thick lead can be processed using an inexpensive, simple subtractive method or patterning and etching techniques. Further, the plating can be formed accurately on the surfaces of the conductor pattern and the lead at the same time.

FIGS. 9(*a*) to 9(*f*) are sectional views showing the fabrication process of a circuit board according to a fourth embodiment of the invention using the subtractive method.

FIG. 9(*a*) shows a state in which a copper foil 102 is formed on a resin substrate 101 by a well-known method to make up a substrate member 103. The resin substrate 101 is generally formed of epoxy resin or glass-epoxy resin.

Next, in FIG. 9(*b*), a dry film resist (DFR) is formed as a first masking 104 on the upper surface of the copper foil, and exposed and developed by a well-known method thereby to form a resist pattern 104*b*.

Next, in FIG. 9(*c*), the etching solution is applied toward the first masking 104 of the resist pattern thereby to conduct the half etching. This half etching melts the peripheral area of the copper foil 102 under the etching solution passed portion 104*a* of the first masking 104. The half etching conditions (etching time, etc.) are adjusted so that the etched portion 111 of the copper foil 102 leaves a desired width at the upper portion of the pattern 117 (FIG. 9(*f*)).

In this way, as shown in the drawings, at the upper portion of the copper foil 102 in proximity to the resist of the first masking pattern 104*b*, the etched portion 111 of the copper foil 102 bites somewhat more inward of the copper foil 102 than the width (d) of the etching solution passed portion 104*a* of the resist pattern. Thus, the width (e) of the etched portion 111 is larger than the resist pattern width (d), while the intermediate area between the upper portion of the copper foil 102 and the boundary surface 106 in contact with the resin substrate 101 is rounded and forms a groove 111 having a substantially U-shaped cross section.

Next, in FIG. 9(*d*), the whole surface of the portion half-etched in the preceding step is coated with a positive liquid resist 112. Under this condition, the whole surface of the portion coated with the positive liquid resist 112 is exposed to the parallel light 113. The light 113 used for this exposure is desirably parallel light rays radiated toward the first masking pattern 104*b* in the direction orthogonal to the surface of the first masking 104 of the circuit board. In the case where the light rays reach deep into the positive liquid resist 112, however, the light 113 is not necessarily parallel light.

In this exposure step, the portion of the positive liquid resist 112 exposed to the light includes the area 112*a* of the positive liquid resist 112 above the first masking pattern 104*b* and the area 112*b* of the first masking pattern 104*b* immediately below the etching solution passed portion 104*a*. In other words, that the part of the area 112*c* under the non-transmitted portion 104*b* of the first masking pattern, which was etched somewhat widely to an extent more into the copper foil 102 than the width (d) of the resist pattern at the time of half etching in the preceding step, is left unexposed. By the way, the resist of the second masking 112 may be formed by electrodeposition whereby the resist is deposited only on the portion having a metal.

This embodiment uses two photosensitive resists making up the first masking and the second masking, i.e. the dry film resist 104 and the positive liquid resist or the positive electrodeposition resist 112. The photosensitive wavelength of these photosensitive resists are required to be appropriately combined with the exposure waveform used. The wavelength of the parallel light 113 selected for exposing the positive liquid resist and the positive electrodeposition resist 112, therefore, is required be absorbed by the positive liquid resist or the positive electrodeposition resist 112 but must not be transmitted through the dry film resist 104.

Next, in FIG. 9(*e*), the exposed portions 112*a*, 112*b* of the positive liquid resist 112 are developed thereby to etch only the light-exposed portions 112*a*, 112*b* of the positive liquid resist. In this way, it becomes possible to remove the etched portions 112*a*, 112*b* of the positive liquid resist 112. The unetched portion 112*c* of the positive liquid resist 112 remains as it is, while the substantially U-shaped groove 111 described above becomes a groove 114 having parallel inner side walls, and the unetched portion 112*c* of the positive liquid resist 112 can be used as a mask pattern (second masking) in the next step.

Then, the secondary etching is performed using as a mask pattern including the dry film resist (first masking) 104 remaining on the surface of the copper foil 102 and the remaining portion 112*c* (second masking) of the positive liquid resist. As a result, the copper foil portion 115 under each parallel-wall groove 114 is etched, and the etched portion reaches the boundary surface 106 where the copper foil 102 and the resin substrate 101 are in contact with each other.

Next, the dry film resist 104 and the remaining positive liquid resist 112*c* are separated.

As a result, as shown in FIG. 9(*f*), a Dharma doll-shaped groove 116 having a narrow central portion and roundly expanded upper and lower portions is formed along the depth. Specifically, the difference (h–g) between the width (g) of the narrowest portion and the width (h) of the widest portion of the cross section of the conductor pattern 117 is much smaller than the width difference (b–a) for the conventional conductor pattern having a trapezoidal cross section shown in FIG. 1(*d*). As a result, the pitch (c) between adjacent pattern portions can be reduced thereby to achieve a finer circuit board.

FIGS. 10(*a*) to 10(*f*) are cross sectional views of the circuit board in fabrication process according to a fifth embodiment using the subtractive method. Unlike in the fourth embodiment, requiring the use of a light-blocking material, the first resist 104 of the fifth embodiment requires no light-blocking characteristic. Only the points in which the fifth embodiment is different from the fourth embodiment are explained below.

First, as shown in FIG. 10(*a*), a dry film resist (DFR) is formed as a first masking 104 on a copper foil 102 of the substrate member 103 on a resin substrate 101, and exposed and developed by a well-known method to thereby form a resist pattern 104b. The resin substrate 101 is generally formed of epoxy resin or glass epoxy resin.

Figure 10A:
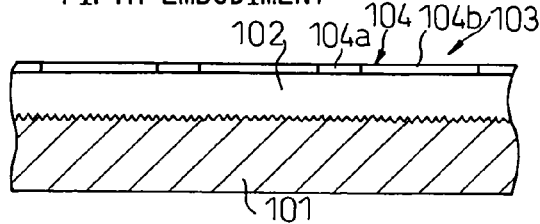
FIGS. 10(a) to 10(f) are sectional views showing the process of fabricating a circuit board according to a fifth embodiment of the invention.
Figure 10B:
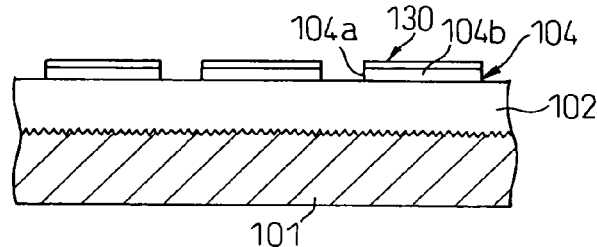

Next, as shown in FIG. 10(b), a light-blocking film 130 is formed on the portion 104b of the first masking 104 providing a the resist pattern. The light-blocking film 130 is formed only on the pattern portion 104b except for each opening 104a of the resist 104 by coating or transfer.

Figure 10C:
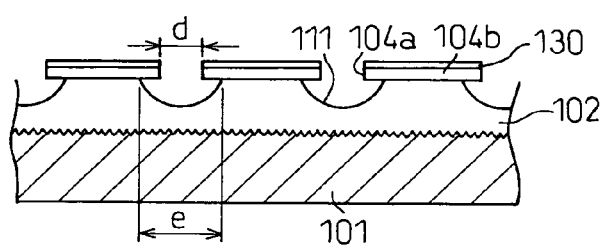

As shown in FIG. 10(c), the etching solution is applied on the copper foil 102 thereby to carry out the half etching process with the resist pattern 104 and the light-blocking film 130 as a first masking. As the result of this half etching process, as in the fourth embodiment, the peripheral area 111 of the copper foil 102 under the etching solution passed portion of the first masking is etched. The light-blocking film 130 may be formed after conducting the half etching process with the resist pattern 104 as a first masking.

Figure 10D:
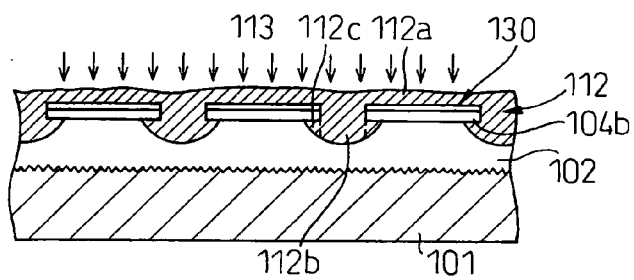

Next, as shown in FIG. 10(d), as in the fourth embodiment, the whole surface including the portion half-etched in the preceding step is coated with the second resist 112 of positive liquid type and exposed. In this case, even though the first resist 104 has no light-blocking ability, the fact that the light-blocking film 130 is formed on the upper surface of the first resist 104 makes it possible to exhibit the light-blocking function sufficiently, at the time of exposure, by use of the first resist 104 and the light-blocking film 130 combined as a second masking.

Figure 10E:
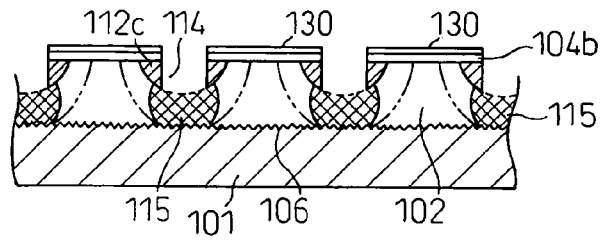
Figure 10F:
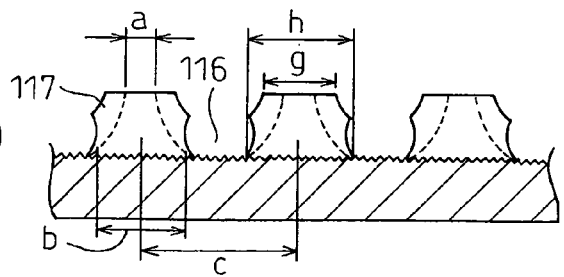

As shown in FIG. 10(e), the exposed portions 112a, 112b of the second resist 112 are developed to thereby etch only the photosensitized potions 112a, 112b of the second resist 112. The unetched portion 112c of the second resist 112 can be used as a mask pattern (second masking) in the next step.

Next, the secondary etching process is executed, as in the fourth embodiment, using a mask pattern including the first resist 104 and the light-blocking film 130 (first masking) remaining on the surface of the copper foil 102 and the remaining portion 112c (second masking) of the positive liquid type.

Then, the light-blocking film 130, the dry film resist (first resist 104) and the remaining positive liquid resist (second resist) 112c are separated.

Figure 9A:
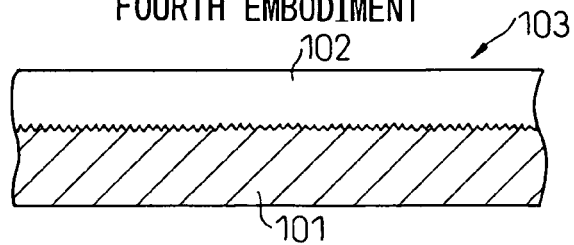
FIGS. 9(a) to 9(f) are sectional views the process of fabricating a circuit board by the subtractive method according to a fourth embodiment of the invention.
Figure 9B:
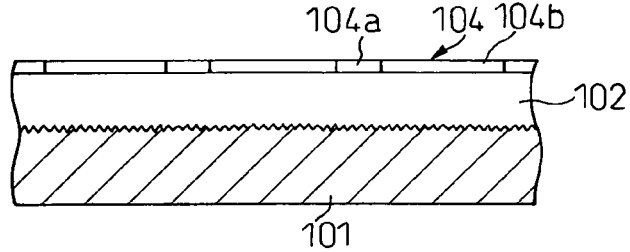
Figure 9C:
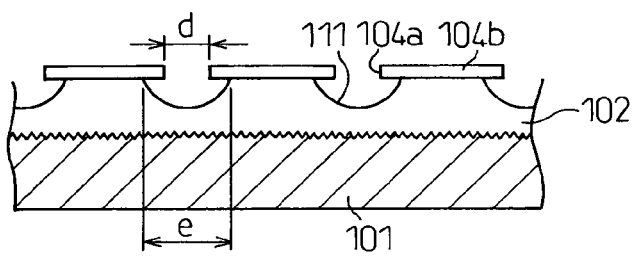
Figure 9D:
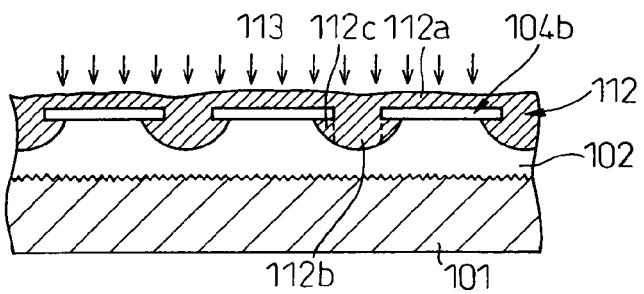
Figure 9E:
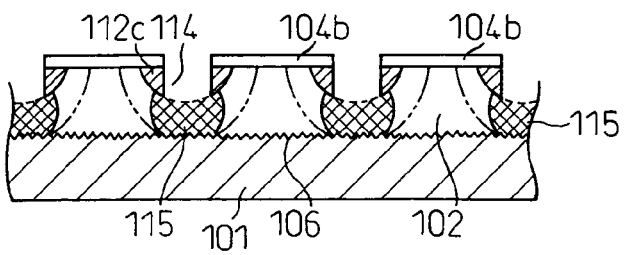
Figure 9F:
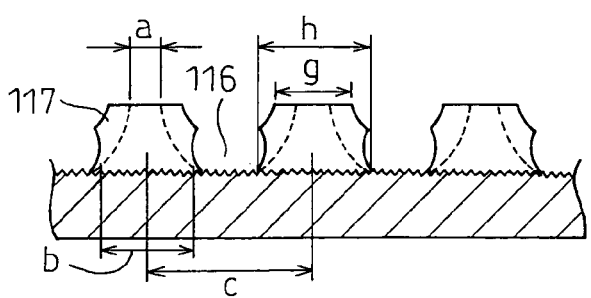

As a result, as in the case of the fourth embodiment, a conductor pattern 117 capable of miniaturizing the circuit board is obtained, as shown in FIG. 9(f). Also, according to this fifth embodiment, the first resist 104 has no light-blocking ability.

FIGS. 11(a) to 11(f) are sectional views showing the fabrication process of the lead frame using the subtractive method according to a sixth embodiment of the invention. This embodiment is basically similar to the fifth embodiment except that the etching process is executed from the two surfaces of the copper plate 102 for application to the lead frame. Only the points different from the fifth embodiment are described below.

Figure 11A:
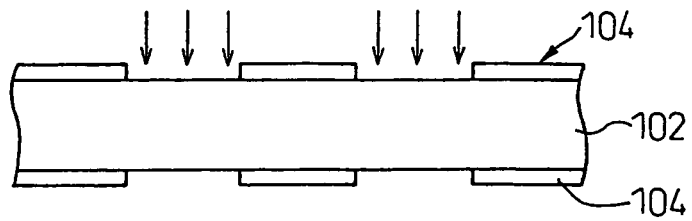
FIGS. 11(a) to 11(f) are sectional views showing the process of fabricating a lead frame according to a sixth embodiment of the invention.

First, in FIG. 11(a), the copper plate 102 providing a substrate of the lead frame is prepared, and the two surfaces of the copper plate 102 are each formed with a dry film resist (DFR) as a first masking, and exposed and developed by a well-known method thereby to form resist patterns 104b.

Figure 11B:
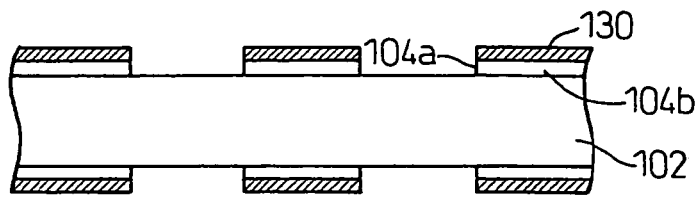
Figure 11C:
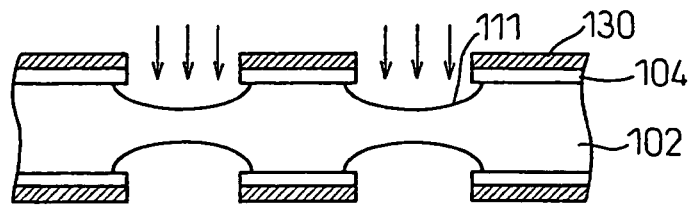
Figure 11D:
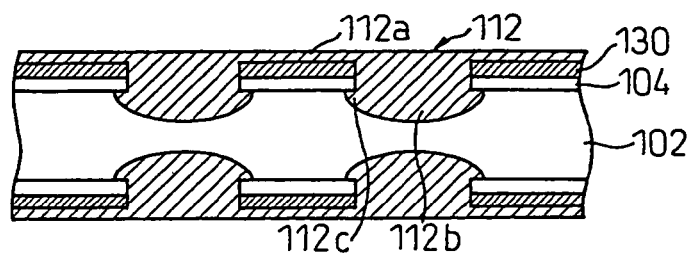
Figure 11E:
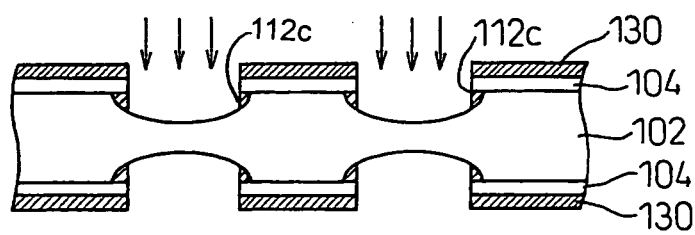
Figure 11F:
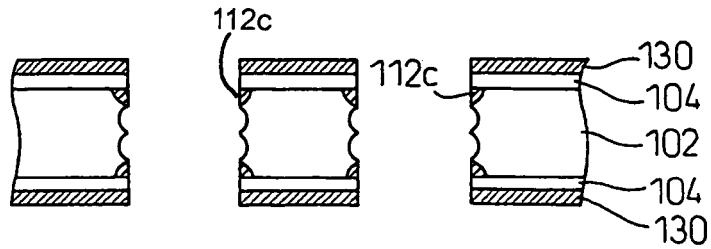

Next, in FIG. 11(b), a light-blocking film 130 is formed on each portion 104b of the first masking 104 formed with the resist pattern on the two surfaces of the copper plate 102. In FIG. 11(c), the half-etching is carried out by applying the etching solution from the two surfaces of the copper plate 102 with the resist patterns 104 and the light-blocking films 130 as a first masking. This half-etching process is carried to an appropriate depth smaller than one half of the thickness of the copper plate 102. In FIG. 11(d), the whole surface including the half-etched portion on the each surface of the copper plate 102 is coated with a second resist 112 of positive liquid type and exposed. In FIG. 11(e), the two surfaces of the copper plate 102 are each formed with a mask pattern (second masking) by developing the second resist 112. Next, in FIG. 11(f), the secondary etching process is executed using a mask pattern including the first resists 104 and the light-blocking films 130 (first masking) remaining on each surface of the copper plate 102 and the remaining portion 112c (second masking) of the second resist of positive liquid type.

The light-blocking films 130, the dry film resists (first resists 104) and the remaining positive liquid resists (second resists) 112c are separated.

As a result, a lead frame having a very small lead width and a lead interval is obtained.

The embodiments of the invention are described above with reference to the accompanying drawings. This invention, however, is not limited to the embodiments described above, but can be modified or changed in various ways without departing from the spirit and scope of the invention.

In the aforementioned embodiment referring to a case in which a conductor pattern is formed on the surface of the resin substrate 1, for example, a TAB tape can be fabricated by use of a flexible resin substrate according to the present invention. In this way, the invention is applicable to all circuit frame or lead frame products fabricated by the subtractive method.

Further, this invention is applicable to a metal plate formed with a fine pattern by etching. In this case, the metal plate is etched from one or two surfaces thereof in accordance with the condition of all the patterns formed.

In the embodiments described above, copper is used for the first metal layers 102 as a member to be etched. Nevertheless, a copper alloy, iron, an iron-nickel alloy/alloy 42, SUS, etc. may alternatively be used with equal effect.

Also, an etching solution may be an aqueous solution of ferric chloride or aqueous solution of cupric chloride normally used. Further, the positive liquid resist may be coated by any of the method using a bar coater and a method of a dip type. The resist (the dry film resist or the positive liquid resist) may be separated using an alkali potassium ferricyanide solution.

It will thus be understood from the foregoing description that, according to this invention, the pitches of the conductor pattern portions can be reduced in the circuit board. Also, the width of the upper portion of the conductor pattern can be secured and a difference can be reduced between the pattern width at the upper portion and the pattern width at the lower portion. Further, the subtractive method can be used for a circuit board having a thick conductor pattern.

What is claimed is:

1. A process for making a circuit board, comprising:
  half-etching a metal layer formed on an insulating substrate through a first mask protecting an upper surface of the metal layer;
  applying a positive liquid resist on the half-etched metal layer from an upper surface of the first mask;
  exposing the positive liquid resist with light from the upper surface of the first mask and developing the positive liquid resist in such a manner that a protected part of the positive liquid resist located under the first mask is unexposed and undeveloped;
  etching again the metal layer through a second mask comprising the first mask and the protected part of the positive liquid resist to form a conductive pattern on the insulating substrate; and removing the first mask and the second mask from the metal layer.

2. A process as set forth in claim 1, wherein, in exposing the positive liquid resist with light from the upper side of the first mask, a parallel light is used.

3. A process as set forth in claim 1, wherein the insulating substrate is flexible so that a tape automated bonding (TAB) type circuit board is thus made.

4. A process for making a circuit board, comprising
forming a first metal layer on an insulating substrate and forming a second metal layer on the first metal layer, the second metal layer having a smaller thickness than that of the first metal layer;
applying a first resist on the second metal layer and patterning the first resist to form openings therein;
etching selectively only the second metal layer through the openings of the patterned first resist;
half-etching the first metal layer through a first mask comprising the first resist and the second metal layer located just under the first resist;
applying a positive liquid second resist on the half-etched first metal layer from an upper surface of the first mask;
exposing the positive liquid resist with light from the upper surface of the first mask and developing the positive liquid resist such that a protected portion of the positive liquid resist located under the first mask is unexposed and undeveloped;
etching again the first metal layer through a second mask comprising the first mask and the protected positive liquid resist, to form a conductive pattern on the insulating substrate; and
removing the first resist and the second resist.

5. A process as set forth in claim 4, wherein, in exposing the positive liquid second resist with light from the upper side of the first mask, a parallel light is used.

6. A process as set forth in claim 4, wherein the insulating substrate is flexible so that a tape automated bonding (TAB) type circuit board is thus made.

7. A process as set forth in claim 4, wherein the second metal layer is removed by etching after the first resist and the second resist are removed.

8. A process as set forth in claim 4, wherein removing the first resist and the second resist comprises: first peeling only the second resist and then removing the second metal layer by etching to remove the first resist.

9. A process for making a circuit board, comprising
forming a first metal layer on an insulating substrate and forming a second metal layer on the first metal layer, the second metal layer having smaller thickness than that of the first metal layer;
applying a first resist on the second metal layer and patterning the first resist to form openings therein;
etching selectively only the second metal layer through the openings of the patterned first resist;
half-etching the first metal layer through by a first mask comprising the first resist and the second metal layer located just under the first resist;
applying a permanent-type positive liquid second resist on the half-etched first metal layer from an upper side of the first mask;
exposing the positive liquid resist with light from the upper side of the first mask and developing the positive liquid resist such that a protected portion of the positive liquid resist located under the first mask is unexposed and undeveloped;
etching again the first metal layer through a second mask comprising the first mask and the protected positive liquid resist to form a conductive pattern on the insulating substrate; and
removing the first resist and the permanent-type positive liquid second resist, except for a part of the second resist protected to be unexposed and undeveloped.

10. A process as set forth in claim 9, wherein, in removing the first resist and the second resist, a solution with which the first resist reacts, but the second resist does not react, is used.

11. A process for making a lead frame, comprising
forming thin, second metal layers on respective surfaces of a metal plate;
applying respective first resist layers on the second metal layers and patterning the first resist layers to form openings therein;
selectively etching the second metal layers through the openings of the respective, patterned first resist layers to form first masks on corresponding opposite surfaces of the metal plate;
half-etching the opposite surfaces of the metal plate through openings of the corresponding first masks
applying a positive liquid second resist on the half-etched opposite surfaces of the first metal layer through the openings of the corresponding first masks; exposing the positive liquid resist with light through the openings of the first masks on corresponding opposite surfaces of the metal plate and developing the exposed positive liquid resist such that protected portions of the positive liquid resist located under portions of the corresponding first masks having no openings therein are unexposed and undeveloped, the protected portions of the positive liquid resist and the corresponding first masks together comprising respective second masks;
etching the metal plate again at the opposite surfaces thereof through the respective second masks, to form a conductive pattern of the metal plate; and
removing any remaining portions of the first and second resist layers.

12. A process as set forth in claim 11, wherein, in exposing the positive liquid second resist with light from the respective sides of the first masks, parallel light is used.

13. A process as set forth in claim 11, wherein the second metal layers are removed by etching after the first resists and second resists are removed.

14. A process as set forth in claim 11, wherein removing the first resist and the second resist comprises: first peeling only the second resist and then removing the second metal layer by etching to remove the first resist.

15. A process for making a circuit board comprising:
coating a metal layer formed on an insulating substrate with a first resist and patterning the first resist;
forming light-blocking film on the patterned first resist;
half-etching the metal layer through a first mask comprising the first resist and the light-blocking film;
applying a positive liquid resist on the half-etched metal layer from an upper surface of the first mask;
exposing the positive liquid resist with light from the upper surface of the first mask and developing the positive liquid resist such that a protected portion of the positive liquid resist located under the first mask masking is unexposed and undeveloped;
etching again the metal layer through a second mask comprising the first mask and the protected positive liquid resist, to form a conductive pattern on the insulating substrate; and removing the first mask and the second masking from the conductive pattern on the insulating substrate formed on the insulating substrate.

16. A process as set forth in claim 15, wherein, in exposing the positive liquid resist with light from the upper side of the first mask, a parallel light is used.

17. A process for making a lead frame comprising:

coating opposite surfaces of a metal plate with corresponding first resist layers and patterning the corresponding first resist layers forming openings therein;

forming respective light-block films on the remaining portions of the corresponding patterned first resist layers to form first masks on corresponding opposite surfaces of the metal plate;

half-etching opposite surfaces of the metal plate through openings of the corresponding first masks, applying a positive liquid resist on the half-etched opposite surfaces of the metal plate through openings of the corresponding first masks;

exposing the positive liquid resist with light through the openings of the first masks on corresponding opposite surfaces of the metal plate and developing the exposed positive liquid resist such that a protected portion of the positive liquid resists, located under portions of the corresponding first masks having no openings therein, is unexposed and undeveloped, the protected portion of the positive liquid resist and the corresponding first masks together comprising respective second masks;

etching again the metal plate at the opposite surfaces thereof through the respective second masks to form a conductive pattern of the metal plate; and removing any remaining portions of the first and the second masks from the metal plate.

18. A process as set forth in claim 17, wherein, in exposing the positive liquid resist with light from the upper and lower sides of the respective first masks, a parallel light is used.

19. A process for forming a fine pattern on a metal plate comprising:

coating one or each of opposite surfaces of a metal plate with a respective first resist layer and patterning each respective first resist layer;

forming a light-block film on each corresponding, patterned first resist layer to form a first mask on the one or each of the opposite surfaces of the metal plate;

half-etching the metal plate on the one or each of the opposite surfaces thereof through openings of the corresponding first mask on the one or each of the opposite surfaces of the metal plate applying a positive liquid resist on the half-etched metal plate through openings of the corresponding first mask on the one or each of the opposite surfaces of the metal plate;

exposing the positive liquid resist with light through the openings of the first mask on the one or each of the opposite surfaces of the metal plate and developing the exposed positive liquid resist such that a protected portions of the positive liquid resist located under respective portions of each corresponding first mask is unexposed and undeveloped, the protected portions of the positive liquid resist and the first mask, on the one or each of the opposite surfaces of the metal plate, together comprising a second mask on the one or each of the opposite surfaces of the metal plate;

etching again the metal plate on the one or the opposite surfaces thereof through the respective second mask on the one or each of the opposite surfaces of the metal plate; and removing any remaining portions of the first and the second masks from the metal plate.

* * * * *

UNITED STATES PATENT AND TRADEMARK OFFICE
CERTIFICATE OF CORRECTION

PATENT NO. : 7,005,241 B2  Page 1 of 1
APPLICATION NO. : 10/822825
DATED : February 28, 2006
INVENTOR(S) : Katsuya Fukase et al.

It is certified that error appears in the above-identified patent and that said Letters Patent is hereby corrected as shown below:

First Page, Column 2, Line 3, after "5/1993" insert -- H01L 21/60 --.
Column 8, Line 16, delete "developed only" and insert -- developed. Only -- therefor.
Column 8, Line 53, delete "patterns" and insert -- pattern -- therefor.
Column 11, Line 7, delete "liquid-type" and insert -- liquid type -- therefor.
Column 11, Line 30, delete "glass-epoxy" and insert -- glass epoxy -- therefor.
Column 13, Line 5, delete "the" before "resist".
Column 15, Line 9, after "comprising" insert -- : --.
Column 15, Line 47, after "comprising" insert -- : --.
Column 15, Line 57, after "through" delete "by".
Column 16, Line 11, after "comprising" insert -- : --.
Column 16, Line 22, after "masks" insert -- ; --.
Column 16, Lines 62-63, after "mask" delete "masking".
Column 18, Line 13, after "plate" insert -- ; --.

Signed and Sealed this

First Day of August, 2006

JON W. DUDAS
*Director of the United States Patent and Trademark Office*